United States Patent
Chen et al.

(10) Patent No.: US 10,225,945 B2
(45) Date of Patent: Mar. 5, 2019

(54) RACK SYSTEM AND SLIDE RAIL ASSEMBLIES THEREOF

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chun-Yi Ho, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

(*) Notice: Subject to any disclaimer, the term of this patent is extended or adjusted under 35 U.S.C. 154(b) by 0 days.

(21) Appl. No.: 15/383,086

(22) Filed: Dec. 19, 2016

(65) Prior Publication Data
US 2017/0367207 A1 Dec. 21, 2017

(30) Foreign Application Priority Data
Jun. 16, 2016 (TW) .............................. 105119024 A

(51) Int. Cl.
*H05K 7/14* (2006.01)
*A47B 88/49* (2017.01)
*A47B 88/493* (2017.01)

(52) U.S. Cl.
CPC ......... *H05K 7/1421* (2013.01); *A47B 88/493* (2017.01); *H05K 7/1489* (2013.01); *H05K 7/1491* (2013.01)

(58) Field of Classification Search
CPC .. H05K 7/1421; H05K 7/1491; H05K 7/1447; H05K 7/1485; H05K 7/1488; H05K 7/1489; F16L 3/015; H04Q 1/06; G02B 6/444
See application file for complete search history.

(56) References Cited

U.S. PATENT DOCUMENTS

| 6,220,456 | B1 | 4/2001 | Jensen et al. | |
| 6,938,967 | B2 * | 9/2005 | Dubon | H05K 7/1421 312/330.1 |
| 6,974,037 | B2 | 12/2005 | Haney | |
| 7,554,819 | B2 * | 6/2009 | Chen | H05K 7/1491 361/727 |

(Continued)

FOREIGN PATENT DOCUMENTS

| EP | 2533383 A2 * | 12/2012 | .......... H02G 3/0475 |
| GB | 2425245 A * | 10/2006 | ............. F16L 3/015 |

(Continued)

*Primary Examiner* — Andrew M Roersma
(74) *Attorney, Agent, or Firm* — Rosenberg, Klein & Lee

(57) ABSTRACT

A rack system includes first and second slide rail assemblies mounted respectively on first and second posts of a rack. The first and second posts define a width therebetween. Each slide rail assembly includes a first rail with a first channel, a second rail displaceable with respect to the first rail, and a third rail movably provided between the first channel of the first rail and the second rail. The first rail of each slide rail assembly has a rail-thickness-wise cross section outside the space in which the width defined by the rack extends, whereas the second and third rails of each slide rail assembly are within the space in which the width defined by the rack extends.

8 Claims, 8 Drawing Sheets

(56) References Cited

U.S. PATENT DOCUMENTS

| | | | | |
|---|---|---|---|---|
| 7,789,350 B2 * | 9/2010 | Yu | ............... | H05K 7/1491 |
| | | | | 248/56 |
| 8,186,634 B2 * | 5/2012 | Chen | ............... | H02G 3/0456 |
| | | | | 248/298.1 |
| 8,235,479 B2 * | 8/2012 | Yu | ............... | A47B 88/49 |
| | | | | 312/334.16 |
| 8,562,085 B2 * | 10/2013 | Chen | ............... | A47B 8/493 |
| | | | | 312/333 |
| 2007/0263949 A1 * | 11/2007 | Chen | ............... | A47B 88/487 |
| | | | | 384/45 |
| 2009/0014601 A1 * | 1/2009 | Chen | ............... | H05K 7/1491 |
| | | | | 248/70 |
| 2011/0180297 A1 * | 7/2011 | Yu | ............... | H05K 7/1491 |
| | | | | 174/69 |
| 2013/0000940 A1 * | 1/2013 | Chen | ............... | H05K 7/1491 |
| | | | | 174/68.3 |
| 2013/0140408 A1 * | 6/2013 | Chen | ............... | H05K 7/1491 |
| | | | | 248/65 |
| 2014/0265790 A1 | 9/2014 | Hashemi et al. | | |
| 2014/0328618 A1 * | 11/2014 | Chen | ............... | H05K 7/1491 |
| | | | | 403/330 |
| 2015/0342081 A1 * | 11/2015 | Chang | ............... | H05K 7/18 |
| | | | | 361/679.02 |
| 2016/0215904 A1 * | 7/2016 | Chen | ............... | H02G 3/32 |
| 2016/0286683 A1 * | 9/2016 | Chen | ............... | H05K 7/1489 |

FOREIGN PATENT DOCUMENTS

| | | | | |
|---|---|---|---|---|
| GB | 2450941 A | * | 1/2009 | ......... H05K 7/1491 |
| JP | 3197171 U | | 4/2015 | |
| JP | 2015-122376 A | | 7/2015 | |
| TW | I276276 B | | 3/2007 | |
| TW | I421047 B | | 1/2014 | |

\* cited by examiner

RACK SYSTEM AND SLIDE RAIL ASSEMBLIES THEREOF

FIELD OF THE INVENTION

The present invention relates to a rack system and its slide rail assemblies. More particularly, the invention relates to a rack system whose slide rail assemblies are configured to be mounted with a relatively wide chassis.

BACKGROUND OF THE INVENTION

In U.S. Pat. No. 6,220,456 B1, Jensen et al. disclose a rack with two posts for supporting at least one chassis.

In U.S. Pat. No. 6,974,037 B2, Haney discloses a rack with four posts and a pair of slide rail assemblies mounted on the rack in order to support a chassis. According to EIA (Electronic Industries Association) standards, the distance between the inner sides of two corresponding posts of such a rack is generally 450 mm. Recently, however, chassis manufacturers tend to design and produce chassis of increasing width, and this trend has reduced the slide rail mounting space between a chassis and its rack, if not compromising the arrangement of slide rails. The present invention was conceived in response to this current market trend.

SUMMARY OF THE INVENTION

It is an objective of the present invention to provide a rack system that allows a relatively wide chassis to be mounted to a rack via a pair of slide rail assemblies.

Another objective of the present invention is to provide a slide rail assembly to which a chassis can be mounted and which can be connected with a cable management arm for arranging the cables behind the chassis.

Yet another objective of the present invention is to provide a slide rail assembly to which a chassis can be mounted securely.

According to one aspect of the present invention, a rack system includes a rack, a chassis, a first slide rail assembly, and a second slide rail assembly. The rack includes a first post and a second post. The first post and the second post define a width therebetween. The chassis has a first lateral side and a second lateral side. The first slide rail assembly and the second slide rail assembly are mounted on the first post and the second post of the rack respectively. The first lateral side of the chassis is mounted to the first slide rail assembly while the second lateral side of the chassis is mounted to the second slide rail assembly. Each of the slide rail assemblies includes a first rail, a second rail, and a third rail. Each first rail has a rail-thickness-wise cross section, which is outside the space in which the width defined by the rack extends. The second rails and the third rails, on the other hand, are within the space in which the width defined by the rack extends.

According to another aspect of the present invention, a slide rail assembly includes a first rail, a second rail, a third rail, and an extension member. The first rail has a first channel. The second rail can be displaced with respect to the first rail. The third rail is movably provided between the first channel of the first rail and the second rail. The extension member is connected to the first rail and has a surface lying substantially in the same plane as an outer surface of the third rail.

According to still another aspect of the present invention, a slide rail assembly includes a first rail, a second rail, a third rail, and an extension member. The first rail has a first channel. The second rail can be displaced with respect to the first rail. The third rail is movably provided between the first channel of the first rail and the second rail and has a second channel. The extension member is connected to the first rail and has a thickness not greater than the width of the second channel of the third rail.

According to yet another aspect of the present invention, a slide rail assembly to be mounted with a chassis includes a first rail and a second rail. The second rail can be displaced with respect to the first rail and includes a first feature and a second feature different from the first feature. The chassis includes a first mounting feature and a second mounting feature to be mounted respectively to the first feature and the second feature of the second rail.

Preferably, the rack includes a third post and a fourth post, which correspond to the first post and the second post respectively in order for the first slide rail assembly to be mounted on the first post and the third post and for the second slide rail assembly to be mounted on the second post and the fourth post.

Preferably, the rack system further includes a cable management arm and an extension member. The cable management arm is mounted to the first slide rail assembly and includes a first arm section and a second arm section connected to and movable with respect to the first arm section. The extension member is connected to one of the first rail of the first slide rail assembly and the first post of the rack. The first arm section of the cable management arm is mounted to the extension member while the second arm section of the cable management arm is mounted to the second rail of the first slide rail assembly.

Preferably, the extension member has a thickness-wise cross section within the space in which the width defined by the rack extends.

Preferably, the second rail of each slide rail assembly includes a first feature and a second feature different from the first feature, and the chassis includes a first mounting feature and a second mounting feature to be mounted respectively to the first feature and the second feature.

Preferably, the first feature and the second feature of the second rail of each slide rail assembly are a first hole and a first projection respectively, and the first mounting feature and the second mounting feature of the chassis are respectively a second projection to be mounted to the first hole and a second hole to be mounted to the first projection.

Preferably, the extension member extends from the first rail.

DETAILED DESCRIPTION OF THE INVENTION

Figure 1:
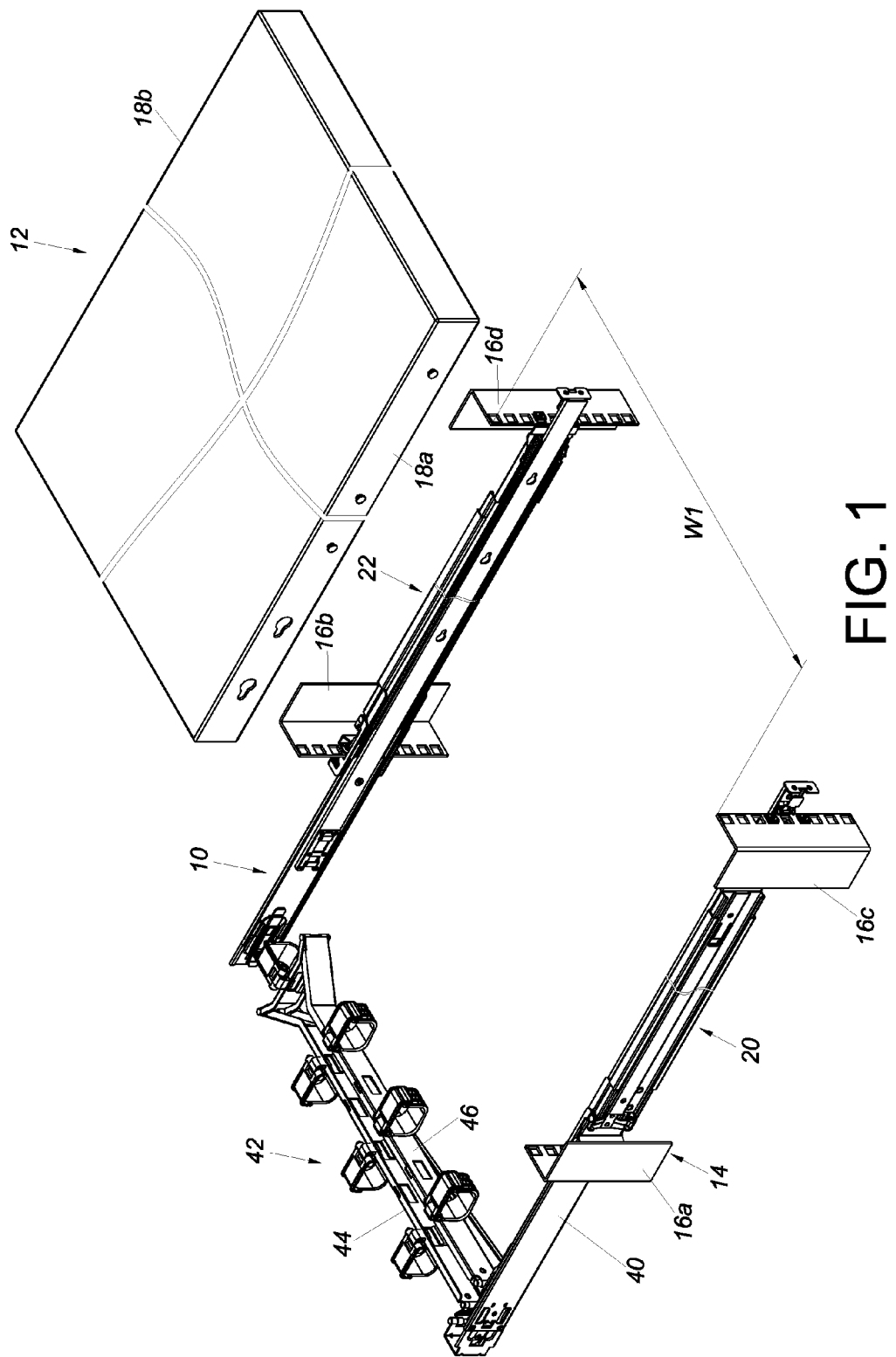
FIG. 1 is a perspective view of the rack system in an embodiment of the present invention, showing the arrangement of a pair of slide rail assemblies, a chassis, and a cable management arm.

Referring to FIG. 1, the rack system in an embodiment of the present invention includes a slide rail unit 10 adapted for mounting a chassis 12 to a rack 14. The rack 14 at least includes a first post 16a and a second post 16b. The first post 16a and the second post 16b define a first width W1 therebetween. The chassis 12 has a first lateral side 18a and a second lateral side 18b. The slide rail unit 10 includes a first slide rail assembly 20 and a second slide rail assembly 22, which are mounted on the first post 16a and the second post 16b of the rack 14 respectively. The first lateral side 18a and the second lateral side 18b of the chassis 12 are mounted to the first slide rail assembly 20 and the second slide rail assembly 22 respectively. In a preferred embodiment, the rack 14 further includes a third post 16c and a fourth post 16d, which correspond to the first post 16a and the second post 16b respectively so that the first slide rail assembly 20 can be mounted on the first post 16a and the third post 16c while the second slide rail assembly 22 can be mounted on the second post 16b and the fourth post 16d.

Figure 2:
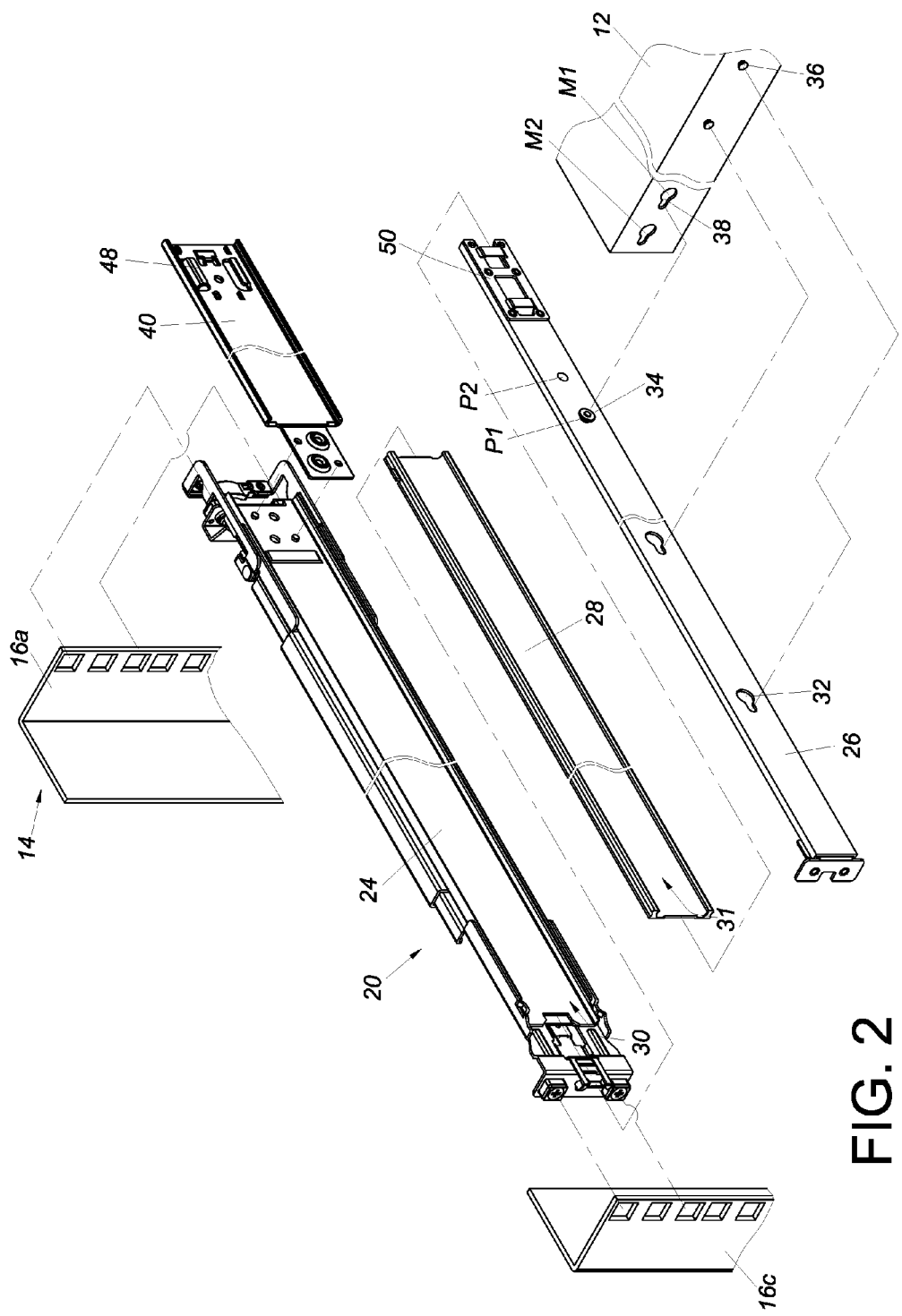
FIG. 2 is an exploded perspective view of a slide rail assembly in an embodiment of the present invention.
Figure 3:
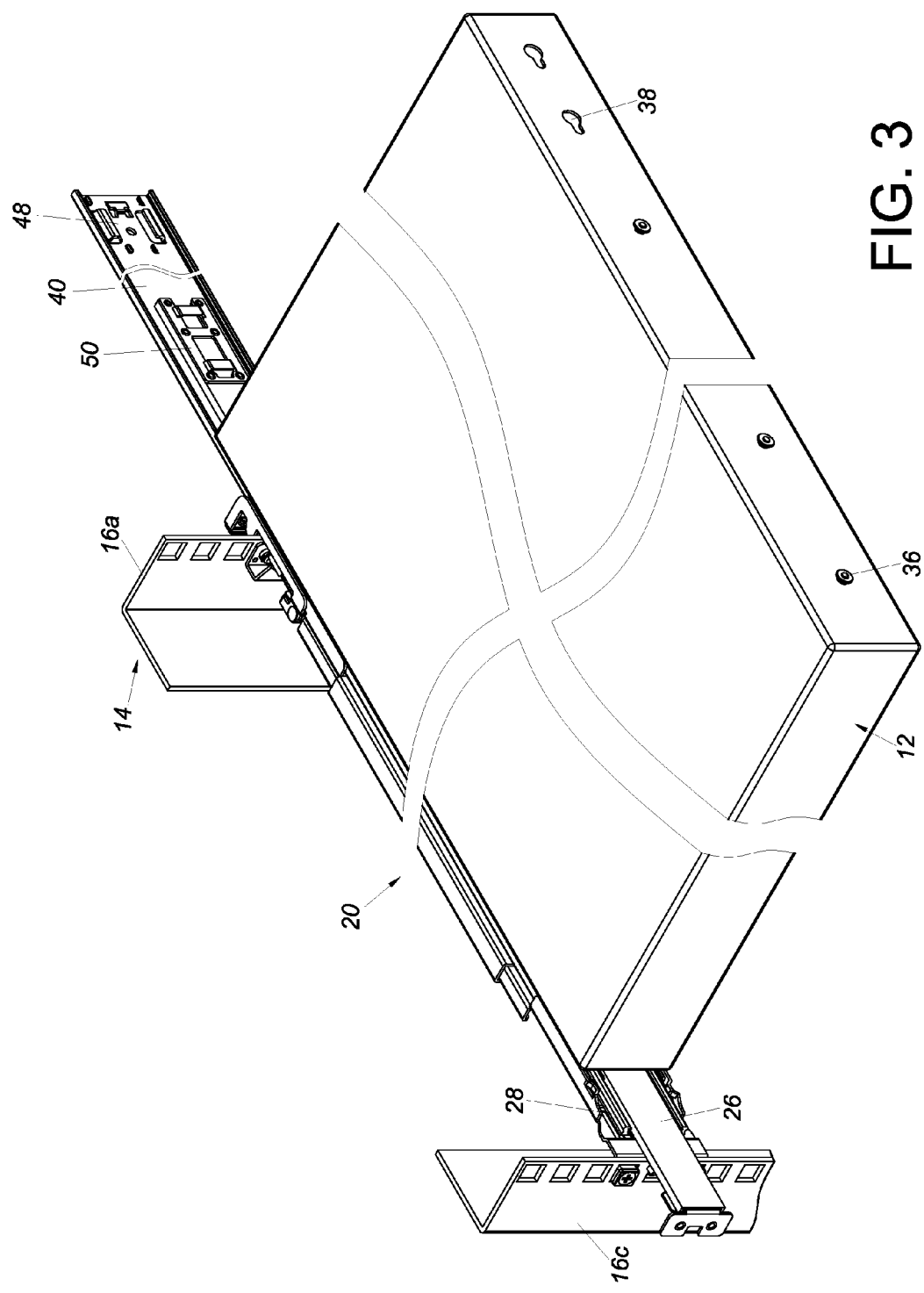
FIG. 3 is a perspective view showing how a chassis is mounted to a slide rail assembly in an embodiment of the present invention.

As shown in FIG. 2 and FIG. 3, the first slide rail assembly 20 includes a first rail 24, a second rail 26, and a third rail 28. The first rail 24 functions as a stationary rail and has a first channel 30. The second rail 26 at least includes a first feature 32 and a second feature 34 different from the first feature 32. The chassis 12 at least includes a first mounting feature 36 and a second mounting feature 38, which are configured to be mounted to the first feature 32 and the second feature 34 of the second rail 26 respectively. In a preferred embodiment, the first feature 32 of the second rail 26 is shaped as a first hole (e.g., a keyhole), and the second feature 34 is a first projection (e.g., a columnar fixing member with a T-shaped profile), to which the second mounting feature 38 can be mounted in a detachable manner. In this embodiment, depending on the length of the chassis 12, the second feature 34 may be provided at a first position P1 or a second position P2 of the second rail 26, and the second mounting feature 38 is provided at a first mounting position M1 or a second mounting position M2 of the chassis 12 in order to be mounted to the second feature 34 as appropriate. The first mounting feature 36 of the chassis 12 is a second projection, e.g., a columnar fixing member to be mounted to the first feature 32 (e.g., the first hole) of the second rail 26. The second mounting feature 38 of the chassis 12 is shaped as a second hole, e.g., a keyhole to be mounted to the second feature 34 (e.g., the first projection) of the second rail 26. The third rail 28 is movably mounted between the first channel 30 of the first rail 24 and the second rail 26. The third rail 28 serves to increase the distance by which the second rail 26 can be extended with respect to the first rail 24. The third rail 28 has a second channel 31, in and along which the second rail 26 can be displaced.

Figure 4:
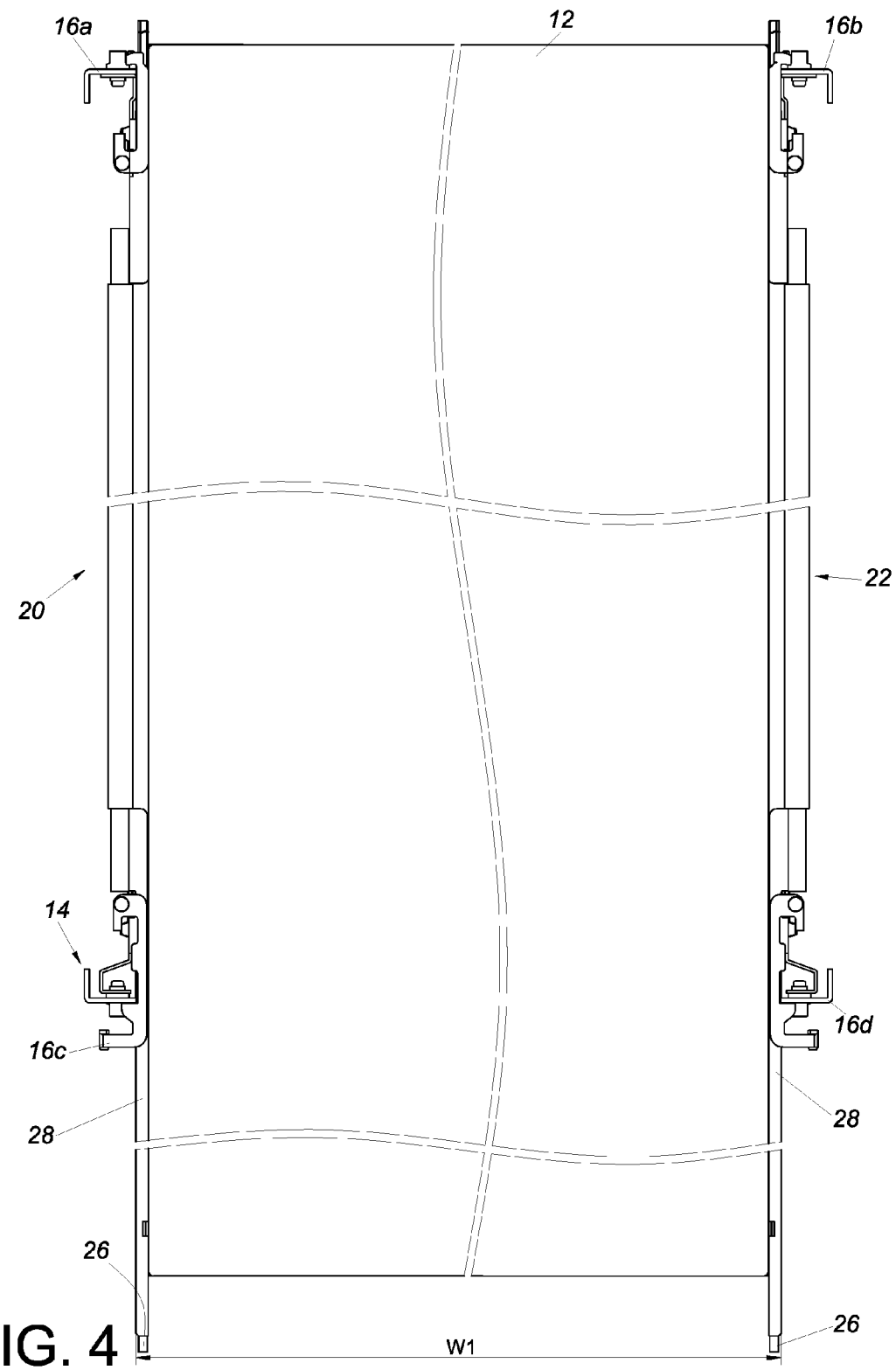
FIG. 4 is a top view showing a chassis mounted on a rack in an embodiment of the present invention.
Figure 5:
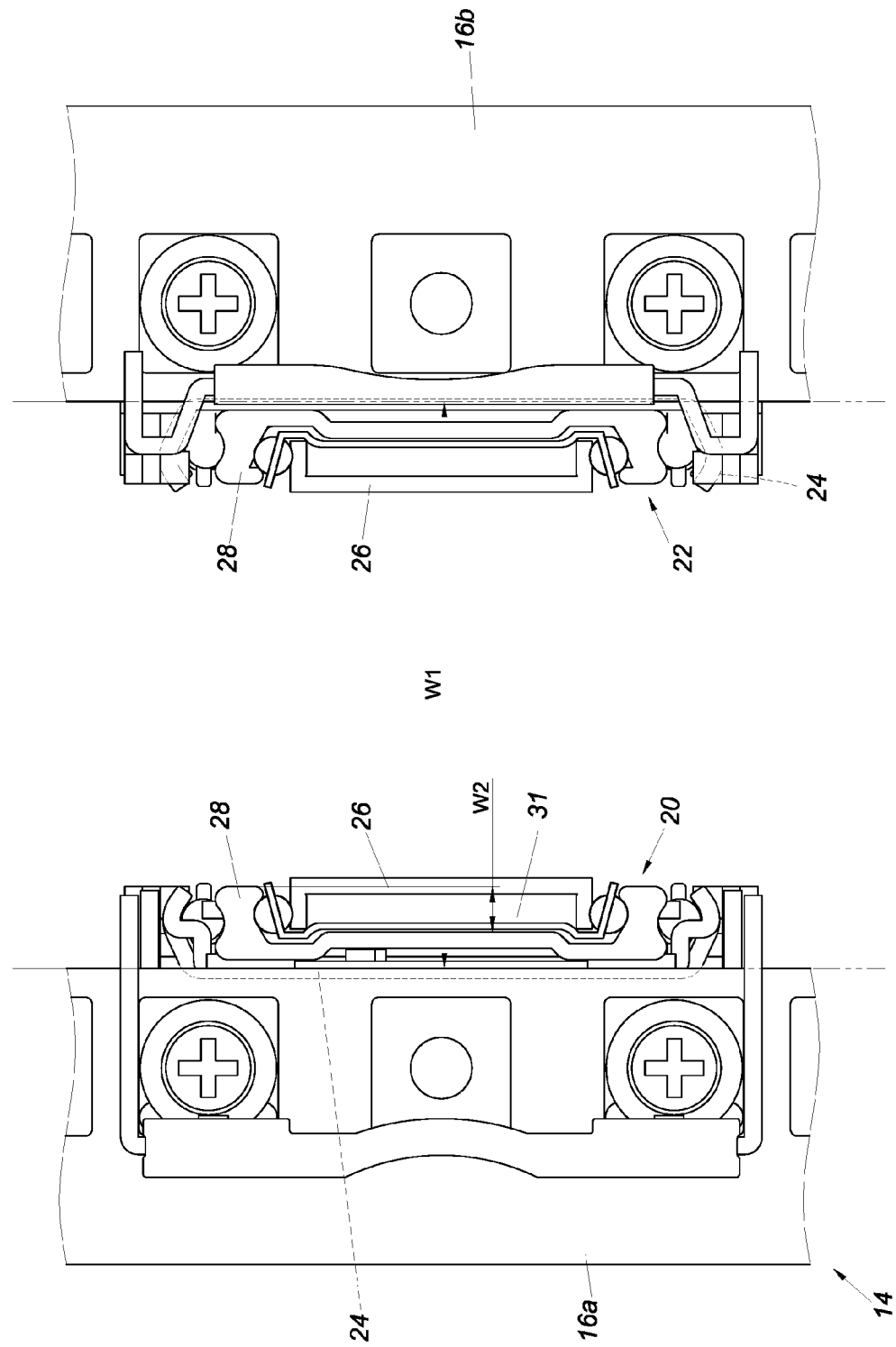
FIG. 5 is a sectional view showing how a pair of slide rail assemblies are mounted to a rack in an embodiment of the present invention.

FIG. 4 and FIG. 5 show how the chassis 12 is mounted to the rack 14 via the first slide rail assembly 20 and the second slide rail assembly 22. The rail-thickness-wise cross section of the first rail 24 of each of the first slide rail assembly 20 and the second slide rail assembly 22 is outside the space in which the first width W1 defined by the rack 14 extends (hereinafter referred to as the extension space of the first width W1 for short) whereas the second rail 26 and the third rail 28 of each slide rail assembly 20 or 22 are within the extension space of the first width W1 of the rack 14. This arrangement ensures that the width of the first rail 24 of each slide rail assembly 20 or 22 does not occupy the extension space of the first width W1 of the rack 14 but makes room for the chassis 12, allowing a relatively wide chassis 12 to be mounted to the rack 14. The second channel 31 of the third rail 28 has a second width W2.

In a preferred embodiment, referring again to FIG. 1 through FIG. 3, the present invention further includes an extension member 40 connected to the first rail 24 of the first slide rail assembly 20 and a cable management arm 42 mounted to the first slide rail assembly 20. The cable management arm 42 includes a first arm section 44 and a second arm section 46 connected to and also movable with respect to the first arm section 44. The first arm section 44 of the cable management arm 42 is mounted to the extension member 40 while the second arm section 46 of the cable management arm 42 is mounted to the second rail 26 of the first slide rail assembly 20. More specifically, the extension member 40 is provided with a first connecting feature 48 for detachable connection with the first arm section 44 of the cable management arm 42, and the second rail 26 of the first slide rail assembly 20 is provided with a second connecting feature 50 for detachable connection with the second arm section 46 of the cable management arm 42.

Figure 6:
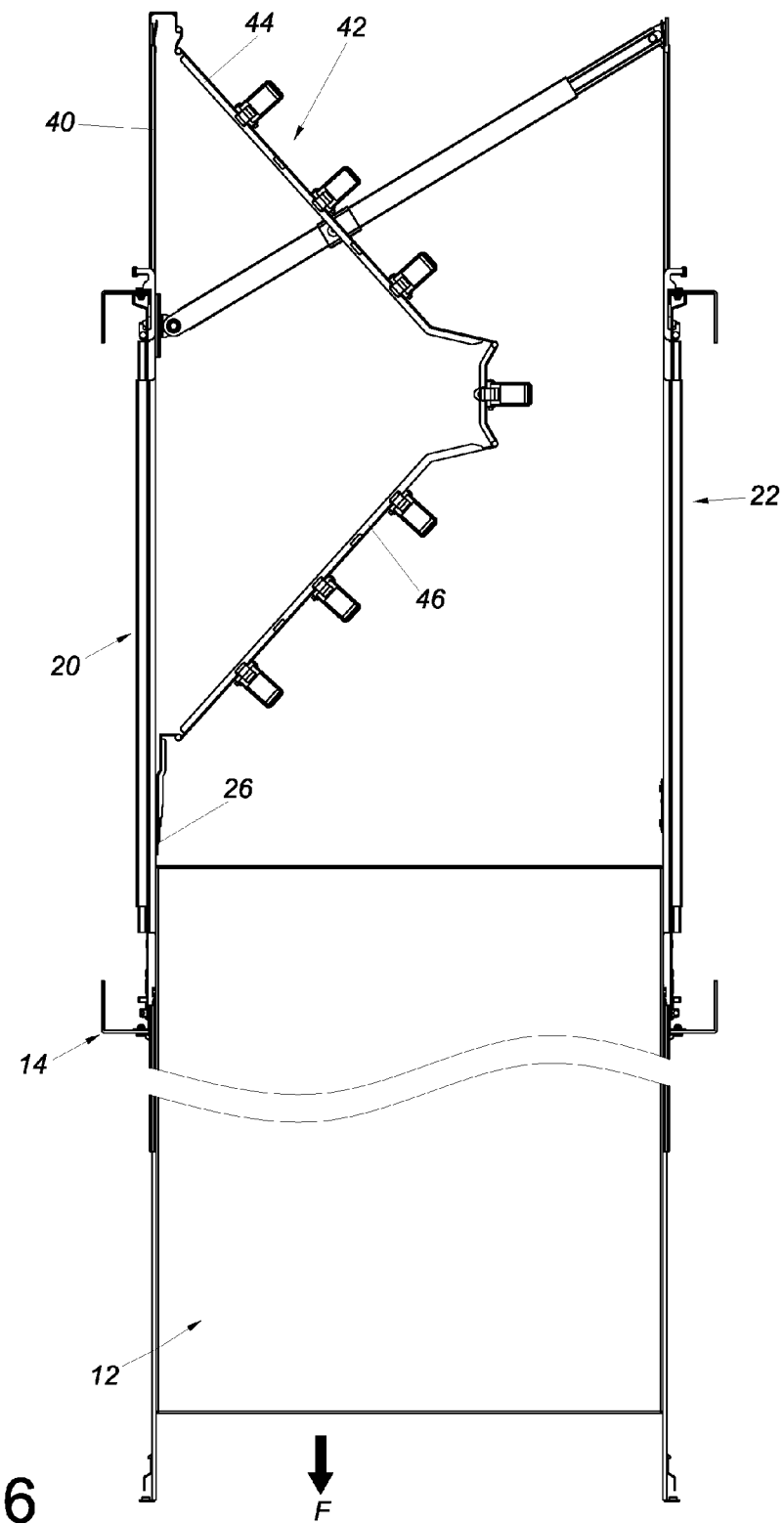
FIG. 6 is a top view showing a chassis pulled out of a rack in an embodiment of the present invention.

Referring to FIG. 6, it should be noted that the cable management arm 42 performs cable management by having its first arm section 44 connected to a fixed position (i.e., the extension member 40) and its second arm section 46 connected to a movable position (i.e., the second rail 26 of the first slide rail assembly 20). When the chassis 12 is pulled out of the rack 14 in the arrow direction F, the cable management arm 42 is driven by the chassis 12 to an extended state.

Figure 7:
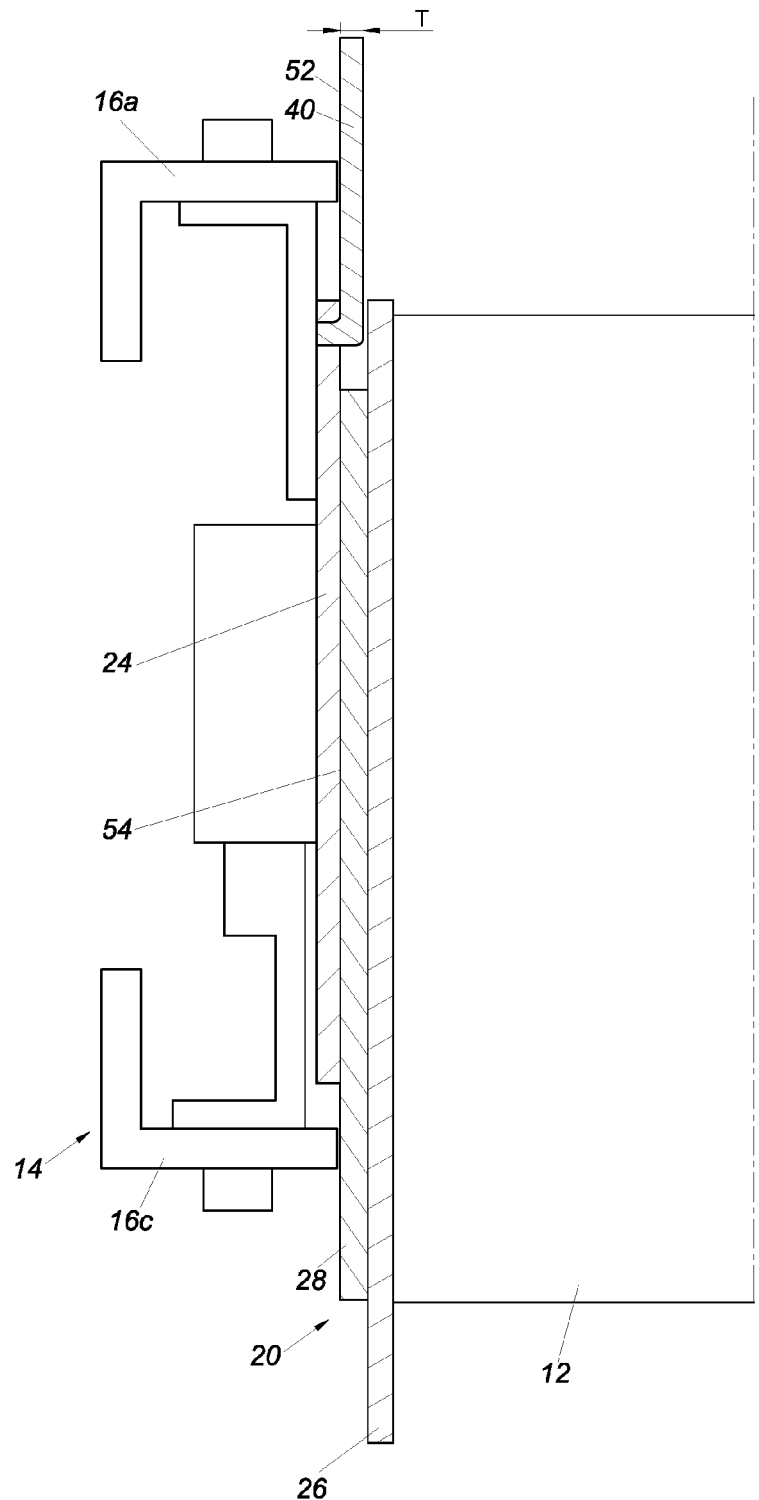
FIG. 7 is a top sectional view showing the mounting arrangement of a slide rail assembly in relation to a chassis and a rack in an embodiment of the present invention.
Figure 8:
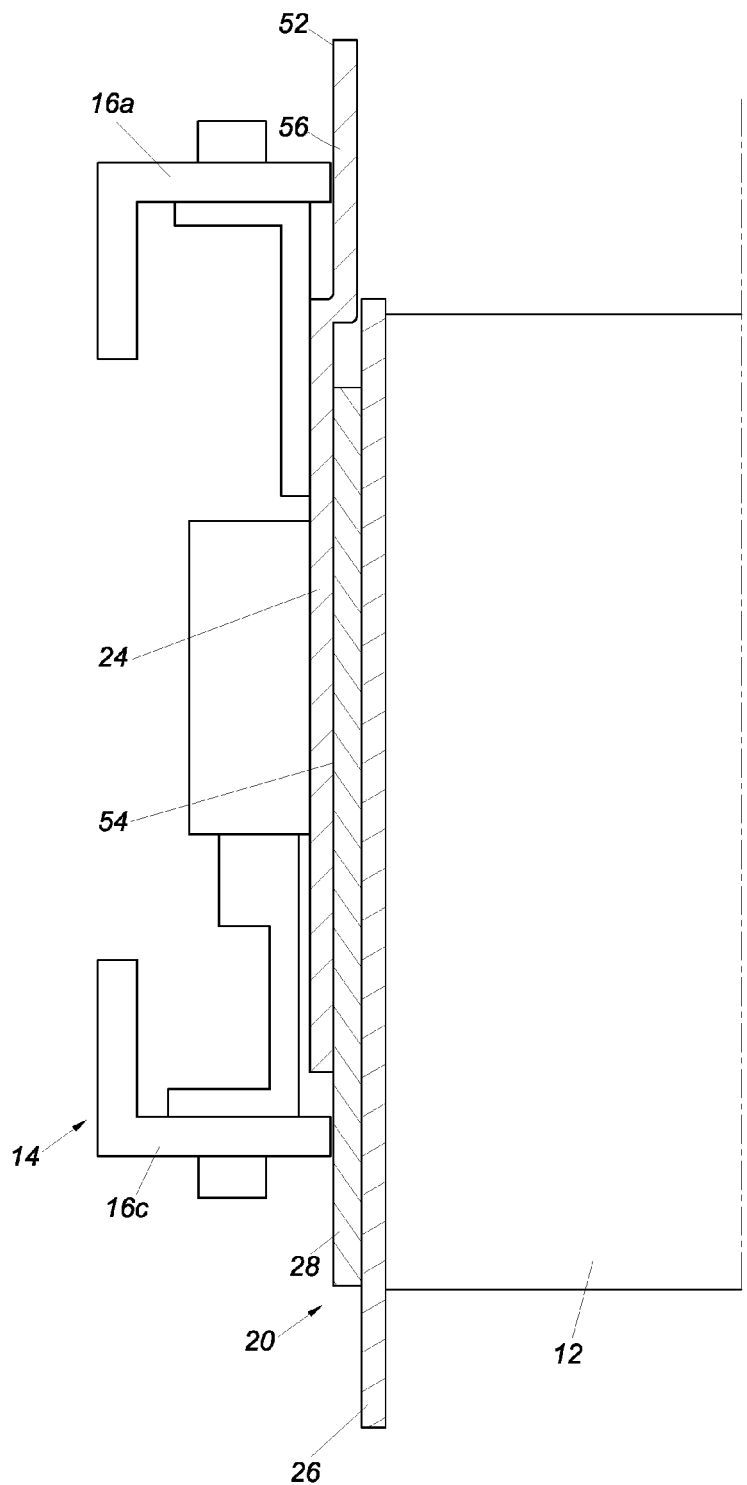
FIG. 8 is a top sectional view showing how the extension member of a slide rail assembly in another embodiment of the present invention extends from the first rail.

FIG. 7 shows how the first slide rail assembly 20 mounts the chassis 12 to the rack 14. As depicted in the drawing, the length of the third rail 28 does not extend beyond the first post 16a of the rack 14. When there is a need to arrange the cables at the rear end of the chassis 12, the extension member 40 can be connected (either fixedly or by mechanical engagement) to the first rail 24 of the first slide rail assembly 20, or the extension member 40 can be connected (either fixedly or by mechanical engagement) to the first post 16a of the rack 14. In a preferred embodiment, the extension member 40 has a surface 52 lying substantially in the same plane as an outer surface 54 of the third rail 28. More specifically, the thickness-wise cross section of the extension member 40 is within the extension space of the first width W1 of the rack 14, or the thickness T of the extension member 40 is not greater than the second width W2 of the second channel 31 of the third rail 28 (see FIG. 5). Thus, the extension member 40 extends the length of the first rail 24, provides a fixed position to which the cable management arm 42 can be connected, but does not interfere with displacement of the second rail 26 with respect to the first rail 24. According to this arrangement, referring back to FIG. 6, the first arm section 44 of the cable management arm 42 can be connected to the extension member 40 (which serves as a fixed position), and the second arm section 46 of the cable management arm 42 can be connected to the second rail 26 (which serves as a movable position), in order for the cable management arm 42 to be extended or folded up (see FIG. 1) as needed. In another embodiment as shown in FIG. 8, the extension member 56 extends from the first rail 24.

While the present invention has been disclosed through the foregoing preferred embodiments, it should be understood that the embodiments provided herein are not intended to be restrictive of the invention. The scope of patent protection sought by the applicant is defined by the appended claims.

What is claimed is:

1. A slide rail assembly, comprising:
   a first rail having an inner surface with a first channel formed therein;
   a second rail being displaceable with respect to the first rail;
   an intermediate rail having opposing inner and outer surfaces and being movably disposed between the first and second rails, the intermediate rail being displaceably disposed in the first channel of the first rail with the outer surface of the intermediate rail facing the inner surface of the first rail and the inner surface of the intermediate rail being in facing relationship with the second rail; and
   an extension member being connected to the first rail and having a portion extending from the first rail, the extension member having opposing inner and outer surfaces with the outer surface thereof being disposed in facing relationship with the inner surface of the first rail, wherein the outer surface of the extension member on the portion of the extension member extending from the first rail lies substantially in a same plane as the outer surface of the intermediate rail, said inner surface of said first rail being out of plane with said inner surface of said extension member, and said inner surface of the extension member on the portion of said extension member extending from said first rail lies substantially in a same plane as said inner surface of said intermediate rail to maintain clearance for displacement of the second rail and thereby enable positioning of a portion of the second rail in overlaying relationship with the portion of the extension member extending from the first rail.

2. The slide rail assembly of claim 1, further comprising a cable management arm mounted to the slide rail assembly, wherein the cable management arm includes a first arm section and a second arm section connected to and movable with respect to the first arm section, the first arm section of the cable management arm is mounted to the extension member of the slide rail assembly, and the second arm section of the cable management arm is mounted to the second rail of the slide rail assembly.

3. The slide rail assembly of claim 1, wherein the second rail of the slide rail assembly includes a first feature and a second feature different from the first feature.

4. The slide rail assembly of claim 3, wherein the first feature and the second feature of the second rail of the slide rail assembly are a first hole and a first projection respectively.

5. A slide rail assembly, comprising:
   a first rail having an inner surface with a first channel formed therein;
   a second rail being displaceable with respect to the first rail;
   an intermediate rail having opposing inner and outer surfaces and being movably disposed between the first and second rails, the intermediate rail being displaceably disposed in the first channel of the first rail with the outer surface of the intermediate rail facing the inner surface of the first rail, the inner surface of the intermediate rail having a second channel formed therein into which the second rail is displaceably received; and
   an extension member being connected to the first rail and having a portion extending from the first rail, the extension member having a thickness not greater than a width of the second channel of the intermediate rail, the extension member having opposing inner and outer surfaces with the outer surface thereof being disposed in facing relationship with the inner surface of the first rail, wherein the outer surface of the extension member on the portion of the extension member extending from the first rail lies substantially in a same plane as the outer surface of the intermediate rail, said inner surface of said first rail being out of plane with said inner surface of said extension member, and said inner surface of the extension member on the portion of said extension member extending from said first rail lies substantially in a same plane as said inner surface of said intermediate rail to maintain clearance for displacement of the second rail and thereby enable positioning of a portion of the second rail in overlaying relationship with the portion of the extension member extending from the first rail.

6. The slide rail assembly of claim 5, further comprising a cable management arm mounted to the slide rail assembly, wherein the cable management arm includes a first arm section and a second arm section connected to and movable with respect to the first arm section, the first arm section of the cable management arm is mounted to the extension member of the slide rail assembly, and the second arm section of the cable management arm is mounted to the second rail of the slide rail assembly.

7. The slide rail assembly of claim 5, wherein the second rail of the slide rail assembly includes a first feature and a second feature different from the first feature.

8. The slide rail assembly of claim 7, wherein the first feature and the second feature of the second rail of the slide rail assembly are a first hole and a first projection respectively.

* * * * *